(12) United States Patent
Millet

(10) Patent No.: US 6,184,140 B1
(45) Date of Patent: Feb. 6, 2001

(54) METHODS OF MAKING MICROELECTRONIC PACKAGES UTILIZING COINING

(75) Inventor: Marcus J. Millet, Westfield, NJ (US)

(73) Assignee: Tessera, Inc., San Jose, CA (US)

( * ) Notice: Under 35 U.S.C. 154(b), the term of this patent shall be extended for 0 days.

(21) Appl. No.: 09/494,080

(22) Filed: Jan. 28, 2000

Related U.S. Application Data

(63) Continuation of application No. 08/989,587, filed on Dec. 12, 1997, now Pat. No. 6,083,837
(60) Provisional application No. 60/032,721, filed on Dec. 13, 1996.

(51) Int. Cl.$^7$ .............................. H01L 21/00; B44C 1/22
(52) U.S. Cl. .............................. 438/691; 216/14; 216/20; 216/52; 438/754
(58) Field of Search .................................. 216/13, 14, 20, 216/33, 52, 56; 438/111, 691, 745, 754

(56) References Cited

U.S. PATENT DOCUMENTS

| | | | |
|---|---|---|---|
| 2,632,693 | 3/1952 | Jenkins | 216/53 |
| 2,716,268 | 8/1955 | Steigerwalt | 29/155.5 |
| 2,757,443 | 8/1956 | Steigerwalt et al. | 29/155.5 |
| 2,958,120 | 11/1960 | Taylor | 29/155.5 |
| 3,039,177 | 6/1962 | Burdett | 29/155.5 |
| 3,148,098 | 9/1964 | Beste | 216/52 |
| 3,389,461 | 6/1968 | Hardardt | 29/625 |
| 3,678,577 | 7/1972 | Weglin et al. | 29/848 |
| 3,923,566 | 12/1975 | Law | 216/52 |
| 3,990,142 | 11/1976 | Weglin | 29/848 |
| 4,090,293 | 5/1978 | van der Donk et al. | 29/883 |
| 4,396,457 | 8/1983 | Bakermans | 216/14 |
| 4,636,930 | 12/1982 | Hoffman | 363/60 |
| 4,651,417 | 3/1987 | Schumacher, III et al. | 29/848 |
| 4,733,292 | * 3/1988 | Jarvis | 216/14 X |
| 4,867,839 | 9/1989 | Sato et al. | 216/18 |
| 4,912,844 | 4/1990 | Parker | 29/848 |
| 5,004,521 | 4/1991 | Makino | 216/14 |
| 5,100,498 | 3/1992 | Takeuchi et al. | 216/14 |
| 5,148,265 | 9/1992 | Khandros et al. | 357/80 |
| 5,148,266 | 9/1992 | Khandros et al. | 357/80 |
| 5,194,698 | 3/1993 | Souto et al. | 174/250 |
| 5,426,850 | 6/1995 | Fukutomi et al. | 29/848 |
| 5,430,614 | 7/1995 | Difrancesco | 361/785 |
| 5,454,905 | * 10/1995 | Fogelson | 216/52 X |
| 5,489,749 | 2/1996 | DiStefano et al. | 174/261 |
| 5,491,302 | 2/1996 | DeStefano et al. | 114/268 |
| 5,518,964 | 5/1996 | DeStefano et al. | 437/209 |
| 5,629,239 | 5/1997 | DiStefano et al. | 216/14 |
| 5,664,325 | 9/1997 | Fukutomi et al. | 29/848 |

FOREIGN PATENT DOCUMENTS

WO 94/03036   3/1994   (WO).

* cited by examiner

Primary Examiner—William Powell
(74) Attorney, Agent, or Firm—Lerner, David, Littenberg, Krumholz & Mentlik, LLP

(57) ABSTRACT

A package for a microelectronic element is made by making a microelectronic component, including embossing a metal sheet to form thin and thick regions, then etching or otherwise removing metal from the sheet in a nonselective removal process and arresting the removal process when the thin regions are removed but before the thick regions are removed. A base material may be applied to the metal sheet to form a dielectric layer for the component. The component is assembled with a microelectronic element to form the package.

42 Claims, 7 Drawing Sheets

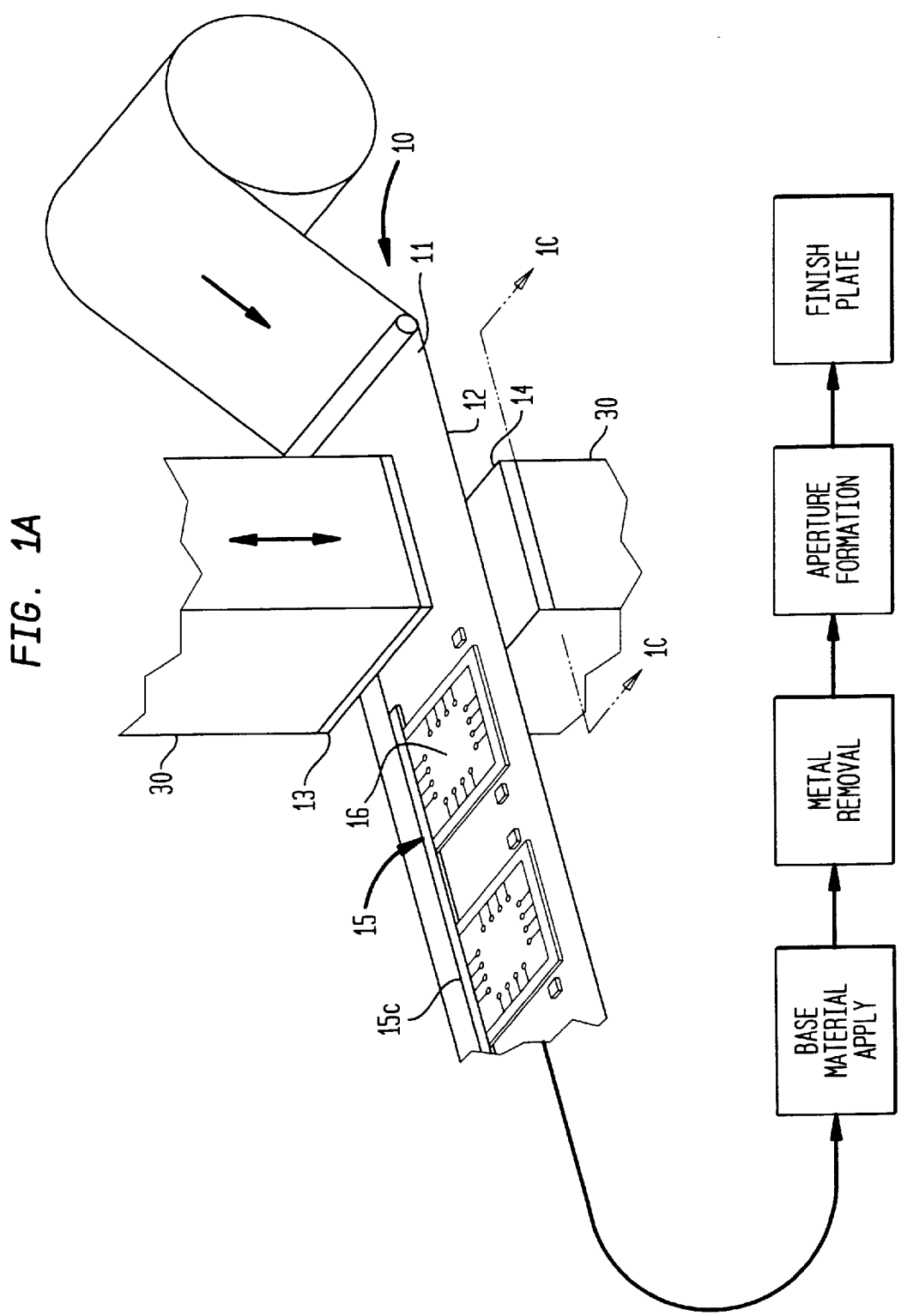

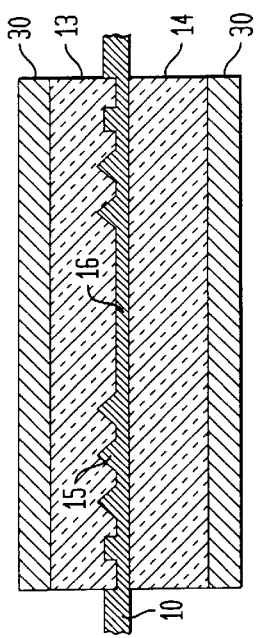
FIG. 1D
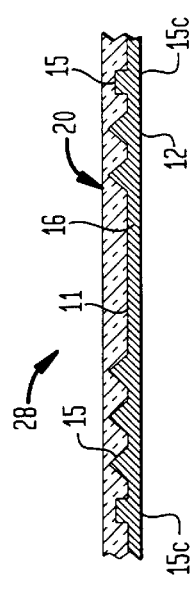
FIG. 1E
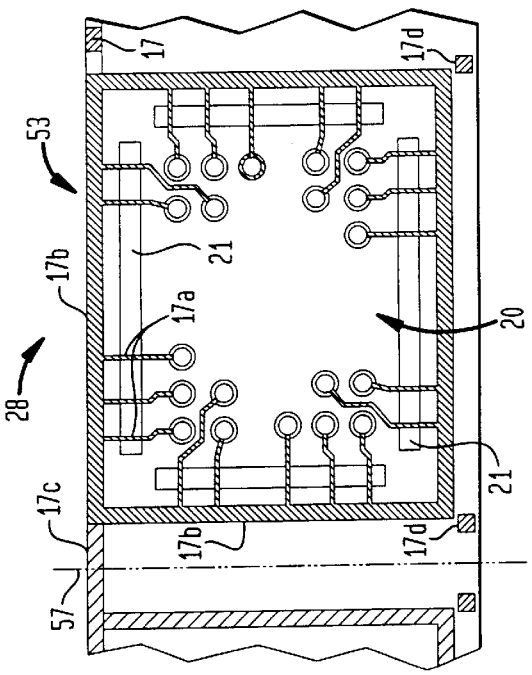
FIG. 1G
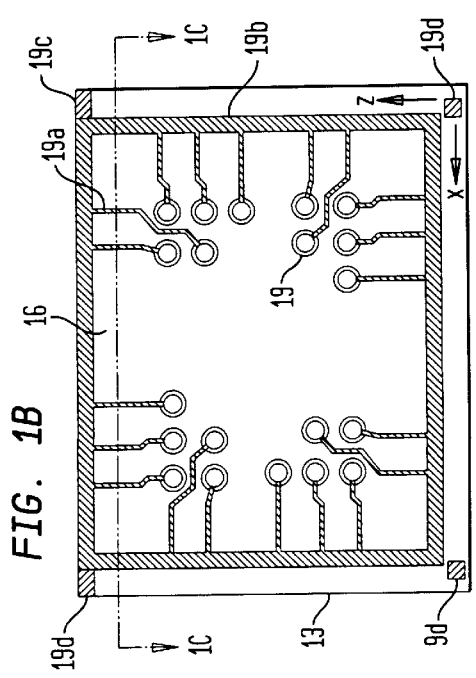
FIG. 1B
FIG. 1C
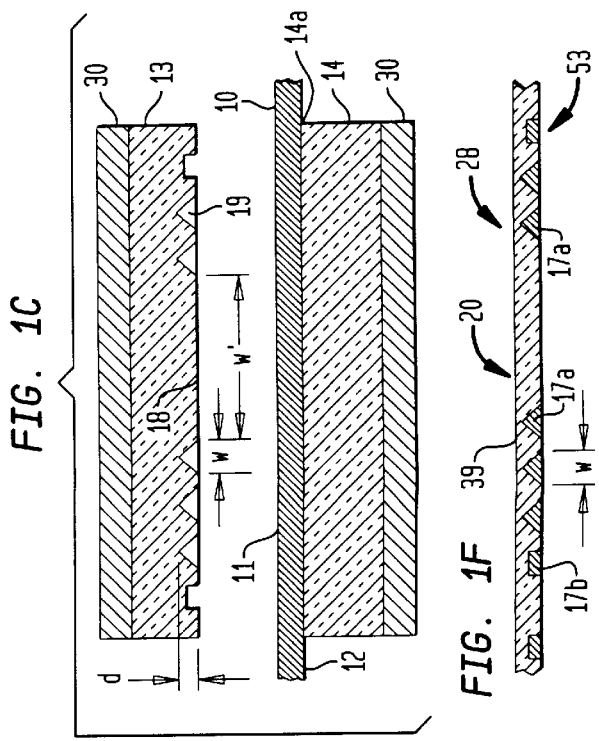
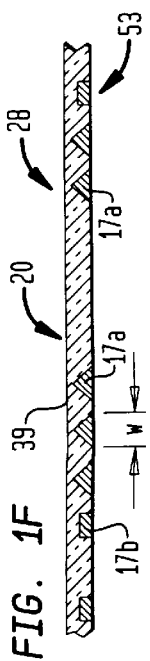
FIG. 1F

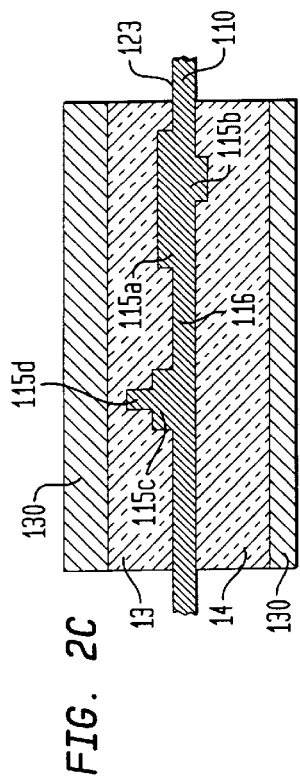
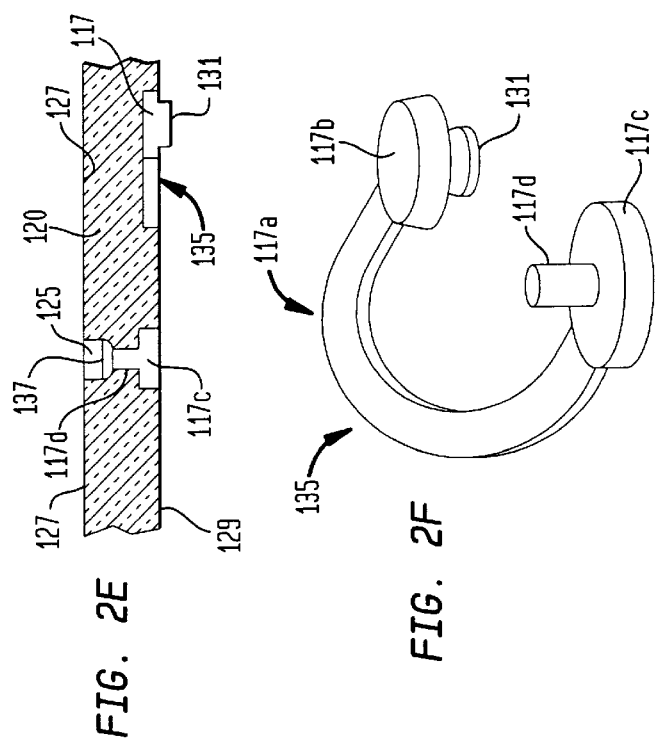
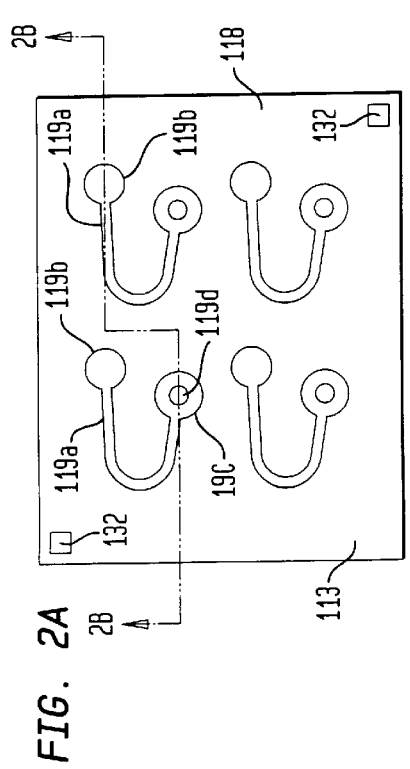
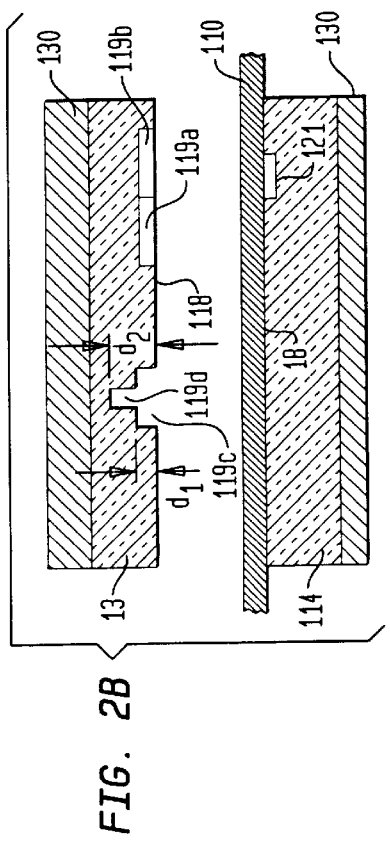
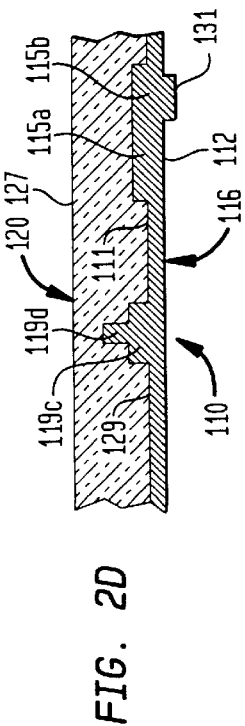

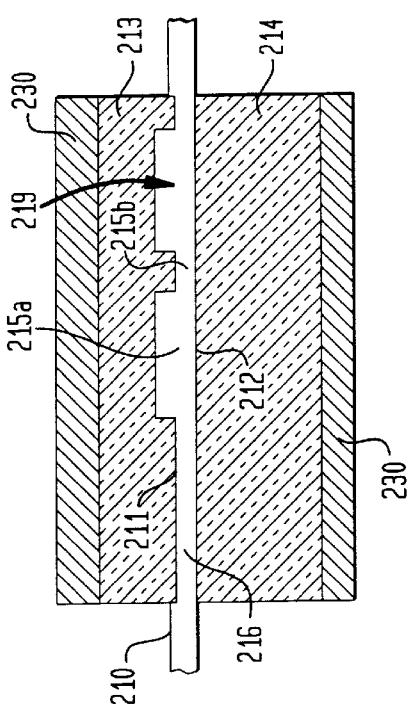
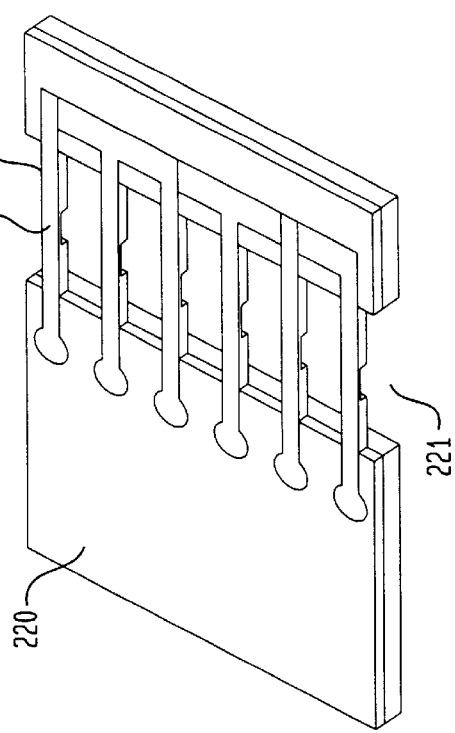
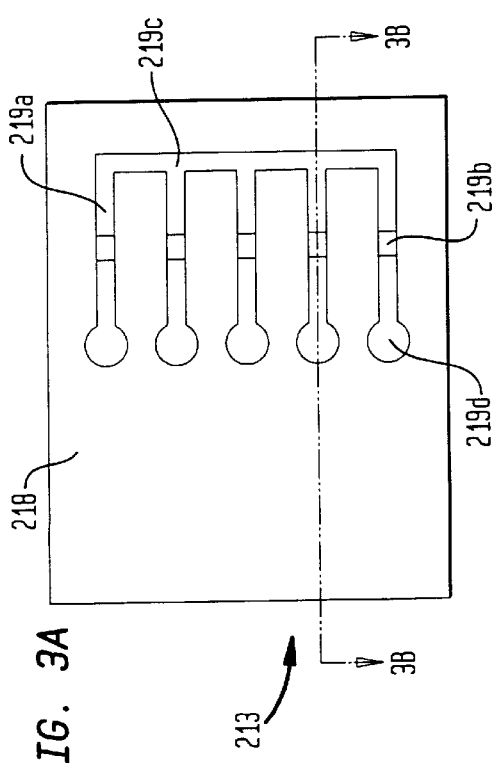
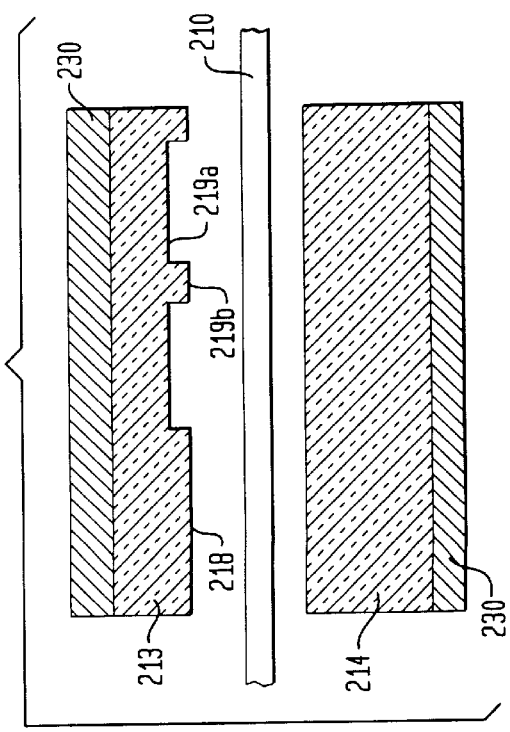

METHODS OF MAKING MICROELECTRONIC PACKAGES UTILIZING COINING

CROSS REFERENCE TO RELATED APPLICATIONS

This application claims benefit of U.S. Provisional Application Ser. No. 60/032,721 filed Dec. 13, 1996 which is a continuation of U.S. patent application Ser. No. 08/989,587, filed Dec. 12, 1997, now U.S. Pat. No. 6,083,837, the disclosures of which are both hereby incorporated by reference herein.

FIELD OF THE INVENTION

The present invention relates to methods of making microelectronic packages and metallic parts and components for the same.

BACKGROUND OF THE INVENTION

Microelectronic packages include components for forming electrical connections between microelectronic devices such as microelectronic chips or wafers and external circuitry. microelectronic packages commonly incorporate conductive elements such as fine metallic leads and terminal structures disposed on a dielectric layer such as a polymeric layer. In conventional tape automated bonding or "TAB" a prefabricated array of leads is provided on a flexible dielectric tape. The leads are bonded to contacts on the microelectronic device. Certain embodiments illustrated in U.S. Pat. Nos. 5,489,749; 5,518,964; 5,148,265; 5,148,266; and 5,491,302 and International Publication WO 94/03036, the disclosures of which are hereby incorporated by reference herein, also incorporate leads and other electrically conductive elements. Leads for use with modern semiconductor chips having large numbers of closely-spaced contacts must be very fine. They may be about 20 to about 40 microns wide. These leads must be provided in precise locations on the connection component. Other components such as circuit panels also include fine metallic features such as conductors.

The metallic elements in these and other components have been fabricated by various processes, most commonly by photochemical processes. In one photochemical process, patternwise etching of a metallic layer is utilized to form the leads. A photographically patterned etch resist is used to selectively etch unwanted portions of the metal layer so that the resist-protected portions form the leads of the connection component. In another method, a metal is plated in areas defined by a photographically patterned resist.

Photochemical processes suffer significant drawbacks in that they require several steps. The resist must be exposed to illumination in the desired pattern, typically by use of a mask. The resist is thereby developed so as to cure only the resist in exposed areas or only the resist in the unexposed areas. The uncured resist is then removed, leaving a mask which has openings in areas where metal is to be removed or added. After etching or plating, the cured resist forming the mask is then removed. These steps entail significant cost and limit the speed of fabrication. Electroplating produces unacceptable irregularities in the metal elements formed when performed too rapidly, also limiting the speed with which the leads may be fabricated. In addition, photochemical processes typically cannot form features smaller than a certain size. This size depends on the type of resist used and the developing process.

Conventional stamping processes have been used to fabricate relatively large metallic elements such as large leads. In a simple stamping process, a sheet of metal is passed between a pair of matched tools referred to as a punch and a die. The punch has a protrusion corresponding to the shape of the part to be formed, whereas the die has a hole precisely matched to the shape of the punch, and just slightly larger than the punch. As the tools are forced together, the punch enters the hole in the die and shears a portion of the metal sheet corresponding in shape to the punch from the remainder of the sheet. In variants of these processes, the tools may perform additional operations such as bending the parts. Stamping processes can be performed rapidly. Although stamping processes can be used to form relatively large, coarse parts, it is typically not practical to stamp very fine leads for use with microelectronic connection components having closely spaced contacts.

Thus, despite the substantial time and effort expended to solve the problems associated with fabrication of leads used in packaging microelectronic elements and other metallic parts, further improvement in such processes would be desirable.

SUMMARY OF THE INVENTION

The present invention improves upon processes for fabricating metallic parts such as the leads of microelectronic packages.

A method of packaging a microelectronic element in accordance with one aspect of the present invention includes making one or more microelectronic components by embossing a layer of metal having a first and a second face by engagement between a pair of forming elements, thereby deforming the metal layer into thick and thin regions. Embossing processes of this type are commonly referred to as "coining", perhaps because these processes are similar to those used to form the raised features on coins. After the embossing or coining step, the thin regions are then removed by a nonselective removal process acting on at least one of the two faces of the metal layer. The nonselective removal process is halted before the thick regions of metal are removed, leaving the thick regions of the metal layer as elements which constitute the metallic part. The component or components are assembled with one or more microelectronic elements.

The embossing step may be performed on either or both faces of the metal layer. One or both of the forming elements have raised and recessed portions arranged so that the recessed portions are in the pattern of the desired conductive elements. The forming elements may be moved linearly towards one another. Alternatively, one or both of the forming elements may be rollers, so that the metal layer is squeezed in a nip between the forming elements as the roller or rollers rotate.

The nonselective removal process may be performed on either or both faces of the metal layer, regardless of which face or faces are embossed. The nonselective removal process may be performed, for example, by etching, reverse electroplating, sputtering or abrading the metal layer.

The embossing step may be performed at an extremely rapid rate, forming impressions in the metal layer at production rates on the order of tens or hundreds of impressions per minute. The nonselective removal process can also be performed rapidly, without the need for time-consuming steps such as selective exposure and development of a photoresist. For example, where the nonselective removal process involves etching or reverse electroplating, the entire layer is simply immersed in the etching or reverse electroplating solution and processed. An unlimited number of components can be subjected to the nonselective removal process simultaneously. Thus, even where the removal process requires substantial time, a high throughput rate can be maintained.

A process according to this aspect of the invention can be used to form extremely small conductive elements which are impractical to form using mechanical processes such as conventional stamping. One limit on the size of the conductive elements formed in processes according to this aspect of the invention is the size of the raised and recessed portions which can be provided in the forming elements. However, the raised and recessed portions in the forming elements may be formed by relatively expensive, precise processes without adding substantially to the cost of the finished product since the die is utilized repeatedly once shaped.

A method according to this aspect of the present invention may include the step of forming a first layer of metal on the metallic elements. For example, certain preferred embodiments include the step of forming a first layer of metal by electroplating onto the metallic elements a layer of metallic material different than the metallic material of the metallic elements. Certain preferred embodiments include forming a second layer of metal on the metallic elements so that the first layer of metal comprises a layer of barrier material to prevent interdiffusion of metallic material between the metallic elements and the second layer of metal.

In certain embodiments, the one or more microelectronic components are made in the form of a plurality of microelectronic components in a continuous strip. The microelectronic components of the strip may be assembled with the one or more microelectronic elements to form a continuous strip of assemblies. The assemblies may be severed from one another after being assembled.

In preferred embodiments, a base material is applied to the metal layer so as to form a coherent layer of the base material supporting the metallic elements. Certain preferred embodiments include forming one or more apertures in the layer of base material in alignment with at least some of the metallic elements. The metallic elements may be formed as elongated leads and the apertures may be formed in alignment with the elongated leads so that the leads extend at least partially across the apertures. Certain preferred embodiments include forming thick regions in the metal layer, including thick regions having different thickness so that the removing step is arrested before the thinnest of the thick regions has been removed so that metallic elements left after the arresting step have different thicknesses. The one or more elongated leads may be forced downwardly into one of the apertures which are in alignment with the elongated lead. In embodiments including thick regions having different thicknesses, the thinnest of the thick regions may include frangible sections so that the elongated leads may be forced downwardly so as to break the frangible sections in the step of assembling. The elongated leads may be bonded to contacts on the one or more microelectronic elements.

Methods according to this aspect of the invention may form metallic elements which are releasable from a base material. The base material may comprise a dielectric material which does not form a strong bond with the metallic material of the metal layer. The metallic elements may include a first end fixed to the base material and a second end which is releasable from the base material. A release-promoting material may be applied to the metal layer prior to application of the base material. The base material may comprise a thermoplastic material applied by limitation.

The steps of making one or more microelectronic components may be performed so as to form the metallic elements as elongated leads. Spots of a bondable alloy may be applied to the elongated leads. In certain preferred embodiments, the spots of bondable material are applied utilizing a patterned photo resist. The step of assembling may include bonding the spots of bondable material to contacts on the one or more microelectronic elements.

The step of embossing may be performed so that metallic elements having an elongated portion, a tip end and a terminal end are formed, the tip end having a width greater than a width of the elongated portion. The tip ends, in certain preferred embodiments, include tapering sides. Spots of bondable alloy may be applied to the tip ends of these metallic elements. The tip ends may be engaged with contacts of the one or more microelectronic elements, the contacts being in a pattern corresponding with the tip ends, and the spots of bondable material may be bonded to the contacts. The assembling step may further include moving the one or more microelectronic components and the one or more microelectronic elements away from each other so that the tip ends are detached from the base material.

The step of embossing may be performed to form metallic elements in a number of different shapes. In certain embodiments, the step of embossing forms cup-shaped features having an open end at the first face of the metal layer and a closed end at the second face of the metal layer. The forming elements may include a first forming element having a recess and a second forming element having a projection in registration with the recess so as to form the cup-shaped features.

The step of embossing may also be performed so as to form a collar-shaped portion in the first face surrounding the open end of each cup-shaped feature. The base material may be applied to the second face of the metal layer so that the closed end of the cup-shaped feature is embedded in the layer of base material. Apertures may be formed in the base material in alignment with the closed end of the cup-shaped feature. The closed end may be electrically connected to the one or more microelectronic elements in the step of assembling.

Methods in accordance with this aspect of the present invention may include utilizing selective removal processes. For example, additional metallic elements may be formed on a second face of the metal layer. The additional metallic elements may be formed utilizing a patterned photoresist applied to the second face. The additional metallic elements are preferably formed in contact with the metallic elements formed from the metal layer. A base material may be applied to the second face of the metal layer, overlying the additional metallic elements. Apertures may be formed, in certain preferred embodiments, in the base material in alignment with the additional metallic elements. The metallic elements preferably have a width of less than 40 microns. A dielectric base material is applied, in certain preferred embodiments, to the first face of the metal layer after the embossing step so that a coherent dielectric layer of the base material is adhered to the first face and intimately surrounds the protruding thick regions and so that the thick regions of the metal layer remain as conductive elements embedded in the dielectric base material after the arresting step.

Preferably, the base material is provided before the nonselective removal step, so that conductive elements formed in that step remain embedded in or otherwise supported by the base material. The step of applying the base material may include applying a dielectric, such as polyimide or similar materials. After the nonselective removal step, the resulting assembly can provide a connection component or other electronic part with conductive elements on a dielectric layer. The dielectric may be applied by applying a flowable material to the metal layer, as by coating the metal layer with the flowable material, and then curing the flowable material to form the dielectric. The step of applying the dielectric material may also include laminating a base material to the metal layer.

Apertures formed in the layer of base material may be used to provide access to the conductive elements. Alternatively or additionally, the base material may include a metal having etching characteristics different from that of the metal layer from which the conductive elements are formed. For example, the metal layer for forming the conductive elements may be comprised of copper and a different metal such as aluminum may be provided as a base material. After the embossing step, the thin regions of the copper layer are etched to produce the conductive elements. Because the aluminum has etching characteristics different from those of copper, the aluminum layer is unaffected by the removal process. The aluminum layer may then be removed by a caustic etch or other process which leaves the copper conductive elements.

In a particularly preferred method according to this aspect of the invention, one or more microelectronic components are formed. A first face of the metal layer is embossed and a flowable polymer such as a polyimide is then applied to the first face of the metal layer by a coating process and cured to form a coherent polymer layer. Next, a chemical etchant or reverse electroplating process nonselectively removes metal from the second face of the metal layer to remove the thin regions of metal. The removal process is continued until the thin regions of metal are removed and the removal process is halted before the thick regions of metal are destroyed. After the removal process, the thick regions of metal remain embedded in the polyimide as the conductive elements of a microelectronic connection component. The one or more microelectronic components are assembled with one or more microelectronic elements.

BRIEF DESCRIPTION OF THE DRAWINGS

These and other features, aspects, and advantages of the present invention will become better understood with regard to the following description, appended claims and accompanying drawings where:

FIG. 1a is a partially perspective, partially block-diagrammatic view of a process in accordance with one embodiment of the invention.

FIG. 1b is a diagrammatic bottom plan view of a forming element utilized in a process of FIG. 1a.

FIG. 1c is a sectional elevational view on line 1c—1c in FIG. 1a, showing the forming element in conjunction with a metal layer and forming element used in the process of FIG. 1a.

FIG. 1d is a sectional view similar to FIG. 1b, at a later time in the process.

FIG. 1e is a sectional view of a metal layer and polymer layer at a later stage in the process of FIG. 1a.

FIG. 1f is a view similar to FIG. 1d, but taken at a later stage in the process of FIG. 1a.

FIG. 1g is a top plan view of the article at a still later stage of the process.

FIG. 2a is a diagrammatic bottom plan view of a forming element used in a process according to a further embodiment of the invention.

FIG. 2b is a sectional elevational view taken along the broken section line 2b—2b in FIG. 2a, showing the forming element in conjunction with a metal layer and another forming element used in the same process.

FIG. 2c is a sectional view similar to FIG. 2b but showing the elements at a later time during the process.

FIG. 2d is a sectional elevational view of an article formed in the process of FIGS. 2a–2c during a still later stage of the process.

FIG. 2e is a sectional view similar to FIG. 2d but showing the article at a still later stage of the process.

FIG. 2f is a diagrammatic perspective view depicting a lead formed in the process of FIGS. 2a–2e.

FIG. 3a is a diagrammatic bottom plan view of a forming element used in a process according to yet another embodiment of the invention.

FIG. 3b is a sectional elevational view taken along line 3b—3b in FIG. 3a, depicting the forming element in conjunction with a metal layer and another forming element used in the same process.

FIG. 3c is a view similar to FIG. 3b but depicting the forming elements and metal layer at a later time in the process.

FIG. 3d is a diagrammatic perspective view depicting a component formed in the process of FIGS. 3a–3c.

FIG. 4b is a sectional elevational view depicting the component formed in the process of FIG. 4a.

BRIEF DESCRIPTION OF THE PREFERRED EMBODIMENTS

Figure 4A:
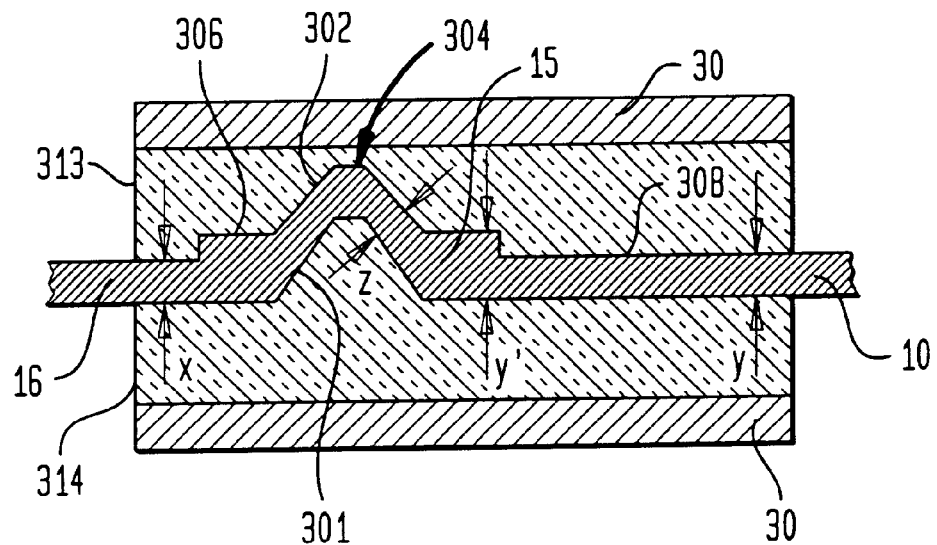
FIG. 4a is a diagrammatic sectional elevational view depicting forming elements and a metal layer during a process in accordance with yet another embodiment of the invention.
Figure 4B:
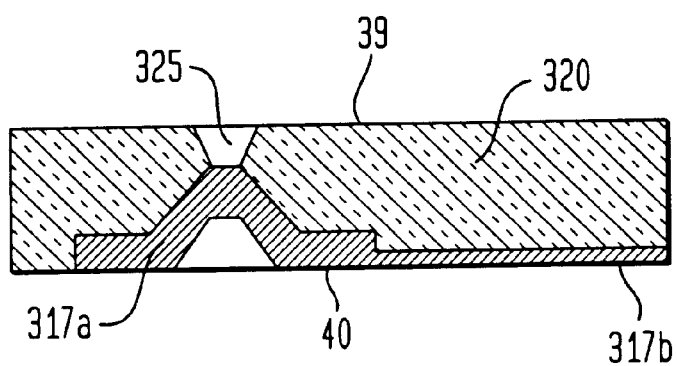

A process for making microelectronic packages in accordance with one embodiment of the present invention is illustrated by FIGS. 1a through 1g. This process uses a first forming element or die 13 and a second forming element 14, also referred to as a backing element. Die 13 has raised portions 18 and recessed portions 19 interspersed with the raised portions. The recessed portions are disposed in a pattern corresponding to the pattern of conductive elements to be formed. FIG. 1b shows a bottom plan view of a die having one such pattern of raised and recessed portions. Preferably, the die has a surface area at least as large as the pattern of conductive elements to be included in a complete connection component, and has a pattern of raised and recessed portions corresponding to the conductive elements of at least one complete connection component. The recessed areas of die 13 include relatively narrow, elongated lead-forming areas 19a connected to broad bus-forming regions 19b. The bus-forming regions 19b in turn are connected to interconnect forming regions 19c extending outwardly from the bus regions to the edges of the die. The die 13 desirably also includes several additional recessed fiducial marker forming areas 19d, just outside of the area occupied by the other recessed areas. The particular pattern illustrated in FIG. 1a is an example only; the process of the invention may be utilized for fabricating conductive elements of almost any shape, in almost any pattern. Backing element 14 has a flat surface 14a. The backing element and die are fixed to the opposing platens 30 of a conventional reciprocating press actuated by a conventional mechanism (not shown) such as a flywheel and clutch assembly, a fluid power cylinder, screw mechanism, toggle mechanism or any other device capable of forcibly moving one or both of the forming elements toward one another.

A metal layer 10 having a first surface 11 and a second, opposite surface 12 is placed between the backing element 14 and die 13. The metal layer is provided as a continuous or semicontinuous strip of any metal suitable for forming conductive leads such as copper, gold and alloys which can include either or both of these metals. While die 13 is in the retracted position shown in FIG. 1c, the strip is advanced to a predetermined position for engagement by die 13. The strip may be advanced using known intermittent strip-feeding techniques commonly employed in the metalworking field.

After the metal layer has been positioned between the forming elements, the forming elements are moved towards one another, as by moving die 13 linearly towards both the metal layer 10 and backing element 14 (downwardly as seen in FIGS. 1c and 1d), so that the die moves in a direction transverse to the metal layer to engage the metal layer. Thus, the forming elements forcibly engage the metal layer and deform it as shown in FIG. 1d. The raised portions 18 of the forming element 13 press against the metal layer 10, squeezing and thinning the metal layer beneath these portions 18 to form thin regions 16 of metal layer 10. The excess metal flows into recessed portions 19 of die or forming element 13, and forms thick regions 15. The press then opens, moving the platens 30 away from one another and leaving the metal layer or strip 10 with the thick regions 15 and thin regions 16 seen in FIG. 1e. The thick regions 15, which will ultimately form the conductive elements and fiducial markers of a connection component, are precisely positioned relative to one another. The precise spatial relationships between the thick areas 15 produced in the metal layer are built into die 13. There is no need for precise registration of die 13 with backing element 14. Further, the dimensions of each thick area 15 are precisely controlled by the die. Provided the die is engaged with sufficient force to fill the recessed areas completely with the metal from the layer, the thick regions 15 will always have consistent dimensions. The thick regions 15 formed on each stroke of the press provide a complete pattern of thick regions for forming a complete connection component. In addition, the thick regions formed on each stroke include interconnect regions 15c connecting the pattern formed on each stroke with the pattern formed on the preceding stroke.

Because the backing element 14 is planar, the thick and thin areas of the metal layer 10 are formed as raised and recessed portions on the first or die-facing surface 11 of the metal layer. The second surface 12 of the metal layer, facing toward the backing element during the forming process remains substantially planar.

The pattern of raised and recessed regions of die 13 is dictated by the required pattern of conductive components in the connection component to be made. However, to maximize the useful life of the die, the raised portions 18 of the die should have as large a dimension in cross-section as possible. Thus, FIG. 1c shows that raised portions 18 have a large dimension w', as compared to recessed portions 19 which have a smaller dimension w.

The die 13 and backing element 14 are preferably made of a rigid, hard material such as a steel of the types commonly utilized for stamping and metal-embossing tools. The recessed portions 19 of the forming element or die 13 can be formed by a number of methods, including methods capable of forming extremely fine features. Patternwise etching using a resist system and photographic developing system may be employed. Electron beam lithography or direct electron beam erosion may be used. Electrical discharge machining, mechanical engraving or any other known machining process may be utilized. The preferred die-making methods can form recessed features on the die smaller than the features achievable by conventional photochemical lead-forming processes, and can form correspondingly small conductive elements. In principle, there is no lower limit on the size of the recessed regions of the die. Thus, the process can be utilized to form conductive elements of essentially any size. For example, the thick regions 15 which will form the conductive elements 17 may have width w of about 40 microns or less, and typically between about 20 and about 40 microns. The ratio of the depth d of each recessed portion 19 in the die to the width w of such recessed portion (the narrow dimension of the recessed portion in the plane of the die surface) desirably is about 3:1 or less, and more preferably about 1:1 or less, to facilitate release of the formed thick sections. Further, the walls of each recessed portion desirably slope outwardly away from one another in the direction toward the die surface to further facilitate release of the formed thick sections from the die. In general, the design practices known for metal coining dies used for making other articles should be followed in design of the die.

In the next stage of the process, a dielectric base material is applied on the first surface 11 of metal layer 10 so that the base material intimately coats the first surface and fills the recesses between thick areas 15 of the metal layer. Base material 20 may be applied by applying a flowable material onto the first surface as depicted in FIG. 1e. The flowable material itself may be a dielectric material. Alternatively, the flowable material may be a conductive material which, when cured, forms a dielectric material. The dielectric material applied in this step will form the dielectric layer of a connection component. Therefore, the composition and thickness of the dielectric material applied in this stage of the process is selected to provide the desired composition and thickness of the dielectric material in the connection component. Polyimide approximately 25 to 75 microns thick is a suitable dielectric material for use in many connection components. Flowable materials may be applied by spin-coating. In spin-coating, the flowable material is deposited on the first surface in a globule adjacent the center of the surface, and the component is spun around an axis perpendicular to the first surface, causing the flowable material to spread over the surface. Where the embossing step is performed with a large metallic layer such as a continuous strip used to form numerous connection components, the step of applying the dielectric base material may be performed while the metal layer remains in this form. Thus, portions of a continuous strip incorporating the complete patterns of thick and thin areas used to form leads for numerous connection components can be covered with the flowable material in a single spin coating operation. Alternatively, the metallic layer may be sprayed with the flowable material, or the flowable material may be applied by means of a brush or roller. Metallic strip 10 with the thick and thin regions 15 and 16 may be advanced continuously or intermittently through such a process. After application of the flowable material, the flowable material is cured to form a continuous, coherent dielectric layer 20 covering the first surface 11 of the metal layer. The resulting composite articles 28 are also in the form of a continuous strip, and remain connected to one another. As best seen in FIG. 1e, the raised or thick portions 15 of the metal layer are embedded in the surface of this continuous dielectric layer 20.

Other methods of applying the dielectric layer may be employed as well. Thus, a sheet of dielectric material 20 may be laminated onto the first surface using conventional lamination techniques. In this case as well, the step of applying the dielectric base material desirably is performed so that the layer of dielectric material is in intimate contact with the first surface. For example, a thermoplastic dielectric material may be laminated to the first surface using heat and pressure to cause the thermoplastic material to flow into intimate engagement with the first surface of the metallic layer.

In the next stage of the process, metal is removed from layer 10 by exposing the composite article 28, including the dielectric layer and the metallic layer, to a chemical treatment which attacks the metallic layer but which does not substantially attack the dielectric layer. For example, where metal layer 10 is formed from copper or a copper-rich alloy, an acid etching solution such as HCl and CuCl may be employed. As seen in FIG. 1f, dielectric base layer 20 protects the first surface 11 of the metal layer from the etchant and hence the etching occurs only at the second surface 12 of the metal layer. Etching occurs nonselectively. The terms "nonselective" and "nonselectively," as used in this disclosure with reference to a process for removing metal from a layer, mean that the removal process removes metal over a continuous region substantially larger than the spacing between conductive elements to be formed. Stated another way, the etching process is not controlled to attack only specific areas in a specific pattern corresponding to the metallic elements to be formed. By contrast, a selective removal process removes metal in a pattern corresponding to the negative of the pattern of the desired metallic elements.

Numerous articles may be exposed to the etchant simultaneously. For example, where the articles are formed in a continuous strip or tape, as by performing the metal layer embossing or forming step and dielectric applying layer steps on a continuous strip, the entire strip may be immersed at once. Alternatively, a strip can be advanced continually into and out of the etching bath. Where each article 28 in FIG. 1a being treated is a separate piece, numerous pieces can be placed into a common etching bath, as by placing the parts within a basket or on a rack and immersing the basket or rack in the etchant.

The etching process desirably is controlled so as to proceed at a uniform rate over the entire surface of each component being treated. Known process conditions for enhancing the uniformity of an etching process may be employed. For example, the etching bath may be gently agitated, and the articles being treated may be moved within the etching bath, during the process to assure that the conditions of exposure to the etchant are uniform over the second surface 12 of the metal layer. The planar second surface 12 of a metallic layer also tends to promote uniform etching speed. As the etchant is agitated, or as the parts move through the etchant, the etchant can flow uniformly over the entire second surface 12, so that the average speed of etchant moving over the surface during the process will be the same for all areas of the surface. Stated another way, the pattern of thick areas 15 and thin areas 16 formed in the metallic layer has no influence on local etching speed.

As the etching process proceeds, metal is removed progressively from the second surface 12 of the metal layer. Eventually, the process reaches the stage where depth of metal removal from the second surface is equal to the original thickness of the thin regions 16. At this point, the thin regions 16 have been entirely removed, as depicted in FIG. 1f, leaving metal only in conductive elements 17, at the locations occupied by the thick regions 15 in the embossed or formed metallic sheet. Metal is left only in conductive elements and fiducial markers 17 corresponding to the thick regions 15 of the metallic sheet formed by the recessed regions 19 of the die.

At this stage, the etching process is arrested by separating the article from the etchant. Preferably, the etchant is washed from the article. A neutralizing solution may also be employed. For example, where the etchant is an acid medium such as HCL/CuCl solution, an alkaline neutralizing agent may be applied. Such a neutralizing step may be followed by a rinsing step in distilled water, and by drying. The condition depicted in FIG. 1f, in which the conductive elements 17 have surfaces exactly flush with the surface of the dielectric layer 20 represents an ideal condition, which is achieved only when the etching process is terminated immediately after the thin region 16 has been etched away. In practice, it is desirable to leave the article in the etchant for a time slightly longer than that which is normally required to remove the thin regions. This will assure that all of the thin regions have been completely removed, even if there is some slight nonuniformity in the etching process. However, this will result in some loss of metal from the conductive elements, so that each conductive element is recessed slightly beneath the adjacent surface of the dielectric layer 20. To compensate for this loss, the depth of recessed portions 19 in the die, and hence the relief depth or height of thick portions 15 above thin portions 16 may be increased slightly. The end point corresponding to removal of the thin portions may be detected by observing the article during the process either visually or with an automated vision system. For example, a beam of light or other electromagnetic radiation at a wavelength transmitted by the etchant solution and by the dielectric layer, but blocked by the metal layer may be directed through the etchant and onto one surface of the article while the article is disposed in the etchant. A photo detector is provided on the opposite side of the article. When the etching process reaches the stage where the thin areas are removed, some of the radiant energy will be transmitted through the article in the regions formerly occupied by the thin areas 16 of the metal layer. The signal from the photo detector will indicate that the end point has been reached. Alternatively, in serial production, the required etching time can be established by trial and error, and once established can be maintained provided that the etching conditions are maintained substantially constant. After the etching step is completed, the article 28 includes conductive elements 17, including leads 17a connected to bus sections 17b and fiducial markers 17d (FIG. 1g) embedded in the dielectric layer 20. The bus sections 17b of adjacent articles in the strip are connected together by interconnect 17c.

After completion of the etching step, gaps or apertures 21 are formed in the dielectric layer in registry with leads 17a. The conductive portions may then be electroplated with additional metals to provide properties such as corrosion resistance, fatigue resistance and ease of bonding. For example, if the leads are formed from a copper alloy, they may be overplated with gold. Preferably, a layer of a barrier metal such as nickel adapted to prevent interdiffusion of gold and copper is applied before the layer of gold. Plating current may be conducted to all portions of the metallic structure by means of the conductive bus structures 17b. Also, the plating process may be performed on numerous elements in the tape or strip simultaneously, using the conductive interconnects 17c extending between the bus structures. At this point, the article 28 comprises a connection component ready for use. The connection component may be handled, stored and assembled to microelectronic components such semiconductor chips while remaining in the continuous strip form. Following such attachment, the connection components may be severed from one another along cutting planes 57 between adjacent connection components on the strip so as to separate the assemblies from one another. Alternatively, the connection components can be severed from one another before adjoining to the microelectronic elements. The leads can be bonded to contacts on the microelectronic elements using processes as mentioned in the aforementioned 94/03036 publication. Fiducial markers 17d may be used to align the microelectronic component with the connection component as, for example, by detecting the positions of the fiducial markers 17d and detecting the positions of features on the microelectronic element using a robotic vision system and bringing the microelectronic element into registration with the connection component. As discussed in the aforementioned '036 publication, a bonding tool is engaged with each lead and forces the lead downwardly into one of the openings or apertures 21 towards the microelectronic element. In this process, the end of each lead attached to bus structure 17b is broken, thereby detaching the lead from the bus structure. To facilitate such breakage, leads 17a may be provided with frangible sections (not shown) having a smaller width than the remainder of the lead. The frangible sections may be performed by providing narrowed sections in the lead-forming recessed regions 19a of die 13.

A process in accordance with a further embodiment of the invention utilizes a die or first forming element 113 having a different pattern of recessed areas 119. The recessed areas include a plurality of curved lead-forming recessed regions 119a, having recessed tip-end forming region 119b at one end of each lead forming region 119a and a terminal end forming region 119c at the opposite end of each lead forming region. Lead forming regions 119a are formed with a triangular cross section similar to the cross section discussed above with reference to FIGS. 1b through 1d, with walls sloping outwardly away from one another in the direction toward the die surface. The tip end forming regions 119b are conical, with steeply sloping, inwardly tapering walls. Each of the terminal end of forming regions 119c is generally cylindrical and has a first depth d1 from the raised surface 118 of die 113. A cylindrical post-forming region 119d extends into the die from each terminal end forming region 119c, to a depth d2 from surface 118. Post-forming regions 119d desirably have the minimum draft angle required to facilitate release of the metal part from the die after forming, as discussed above. The depth of terminal end forming regions 119c is greater than the depth of tip end forming regions 119b and greater than the depth of lead forming regions 119a. Thus, the die includes recessed regions having various depths. Die 113 also has fiducial region forming recesses 132 outside the region occupied by the other recesses. The backing element or second forming element 114 used in this process has recessed regions 121 (FIG. 2b) formed at spacings corresponding to the spacings of tip end forming regions 119b.

In the process, a copper or other suitable metallic strip or sheet 110 is advanced between the die 113 and the backing element 114 and the die is forced against the metal sheet and backing element using a conventional press with platens 130. This action forms a pattern of thin regions 116 and thick regions 115 in the metallic sheet 110. The thick regions include lead regions 115a corresponding to the lead-forming regions 119a of the die. In the manner discussed above, the lead regions 115a project outwardly from the first surface 111 of metallic sheet 110. The thick regions 115 further include tip end regions 115b. These regions project outwardly from the first surface 111 in the areas corresponding to the recessed regions 119b of the die, and also bulge outwardly from the opposite, second surface 112 of the sheet in the areas corresponding to the recesses 121 of backing element 114. The thick regions 115 further include terminal end regions 115c and post regions 115d projecting out of the first surface 111 of the sheet to different depths in accordance with the different depths of the recessed regions in the die. The thick regions further include fiducial regions (not shown) corresponding to the fiducial region forming recesses 132 in the die.

This process does require control of registration between the die and the forming element. However, the registration required is less precise than that which would be required in a set of matched stamping dies to form features of a comparable size. Thus, recessed region 121 must be aligned with recessed region 119b in order to form a common thick region 115b. However, the recessed region 121 on the backing element need not be exactly centered in recessed region 119b on the die. Registration between these elements may be maintained in the manner normally used to maintain registration between matched forming elements in the metal working art. For example, the press may be arranged to maintain very precise registration between platens 130. The dies and backing element may be positioned and adjusted on the platens until the desired registration is achieved. Once set, the registration will be maintained.

In the manner discussed above, a dielectric layer 120 is applied over the first surface 111 of the metal sheet. The dielectric layer 120 has a first or top surface 127 remote from metal sheet 110 and a second or bottom surface 129 contiguous with the top surface 111 of the metal sheet. Here again, a base material is applied in such a manner so as to form a dielectric layer in intimate engagement with the metal sheet 110 and filling in the regions around the raised or protruding elements 115 on the first surface of the metal sheet. In this embodiment, however, the dielectric material desirably does not form a strong chemical bond with the metal of the sheet. The sheet may be pretreated with a release-promoting material such as a fluoropolymer or silicone before application of the dielectric material. Alternatively, the dielectric material may be a thermoplastic such as a polyolefin applied by lamination.

Before etching, spots 131 of a bondable alloy such as a gold-tin or other eutectic bonding material or a solder are applied on the bottom ends of tip end structures 115b. Once again, a barrier metal (not shown) may be applied to prevent undesired interaction between the material of the metal sheet and the bonding alloy. The selective spot application process may be a plating process using conventional photoresist applied and photographically developed on second surface 112 in registration with the pattern of tip end regions 115b on the metal sheet. Because the metallic sheet 110 is continuous at this stage of the process, the metallic sheet can be used to conduct plating current to all of the tip end regions 115b.

After the photoresist is removed, the metal sheet is etched again, in the manner described above. Here again, the etching proceeds from the second surface 112 of the metallic sheet. The projecting portions of tip end regions 115b beneath spots 131 are largely protected from the etchant by the spots. However, some undercutting around the edges may occur. Here again, the etching process is continued until the thin regions 116 are removed. However, the etching process is arrested before the thinnest ones of the thick regions 115 are removed, i.e., before lead regions 115a are removed. This leaves the article with numerous individual, separate leads 135, unconnected to one another, on the bottom surface 129 of dielectric layer 120. Each lead has a tip end region 117b corresponding to the thick portion 115b of the metal sheet, a terminal end portion 117c corresponding to terminal end regions 115c of the metal sheet and a flexible lead portion 117a extending between the tip end and the terminal end. Each lead also has a post 117d extending upwardly into dielectric layer 120, towards the first surface 127.

The terminals ends 117c are relatively strongly held in the dielectric material by posts 117d. The tip ends 117b of the leads are only loosely held in the dielectric material because the tip ends have outwardly tapering sides. Likewise, leads 117a, having outwardly tapering sides defining a triangular cross section, are only loosely held by the dielectric materials. By contrast, the terminal ends 117c are more firmly held in the dielectric by posts 117d extending deeply into the dielectric. Holes or apertures 125 are formed in the dielectric layer 120 from the first surface 127 of the dielectric, in registration with posts 117d. The fiducial markers formed in the process may be used to provide registration for forming holes 125. Holes 125 expose tips of posts 117d at the first surface 127 of the dielectric layer 120. A bonding material 137 such as a solder or other metallic bonding material may be applied to the tips of the posts. This further anchors the posts 117d and the terminal ends 117c of the leads. The connection component is then severed from the strip.

A connection component discussed above with reference to FIGS. 2a–2f may be used in a process for connecting a microelectronic element as taught in U.S. Pat. No. 5,518, 964. As further discussed in the '964 patent, a microelectronic element such as a semiconductor chip or wafer having contacts in a pattern corresponding to the tip ends 117b of the leads is engaged with the tip ends and the tip ends are bonded to the microelectronic component. The connection component and microelectronic component are then moved away from one another, so as to detach the tip ends 117b of the leads from the dielectric layer 120 and bend the leads into a more vertically extensive configuration. Of course, a typical connection component used in such a process includes many more leads than are illustrated in FIG. 2f.

As shown in FIG. 3a, a die 213 may have recessed portions including lead-forming portions 219a of a constant depth, interrupted by frangible element forming portions 219b. The frangible element forming portions 219b are recessed to a lesser depth relative to die surface 218 than the lead-forming portions 219a. Die 213 also has bus-forming portion 219c, and terminal-forming portions 219d of the same depth as lead-forming portion 219a. Die 213 is used with a planar backing element 214. The forming process yields a structure including thin portions 216, lead portions 215a having a thickness substantially greater than the thin portions 216 and frangible element forming portions 215b interrupting each lead-forming portion. The frangible element forming portions 215b have a thickness greater than the thin portions 216 but less than the thickness of the lead-forming portions 215a. The thick portions of the sheet project from the first surface 211 of the sheet, whereas the second surface 212 is planar. After forming, the sheet is provided with a dielectric layer 220 overlying the first surface 211. The sheet is then etched from the second surface, leaving leads 217a, each having a frangible portion 217b. An aperture 221 is formed in the dielectric sheet, as by laser ablation, leaving the leads projecting across the aperture. Once again, the metallic structures can be plated with a bondable material such as gold over a barrier layer. These leads can be connected to a microelectronic component in the manner discussed in WO 94/03036. As each lead is bent downwardly, each lead is broken at frangible section 217b.

As shown in FIG. 4a, forming elements 313 and 314 may be provided with a projection 301 on one forming element matching with a recess 302 on the opposite forming element. The die and forming element are used in registration with one another, so that projection 301 is aligned with recess 302. These mating features form generally cup-shaped features 304 in the metallic sheet. Additional recessed portions 306 surrounding recesses 302 may be provided to form a collar around the cup-shaped feature 304, whereas still further recessed portions 308 may be provided in one or both of the forming element to form elongated lead regions projecting from the collar 306. After application of a dielectric sheet 320, the resulting structure has blind vias 317a connected to leads 317b. Holes 325 may be formed through the dielectric layer from the opposite side of the dielectric sheet, so as to expose the ends of the blind vias 317a for connection to further elements.

Numerous variations and combinations of the features discussed above can be used without departing from the present invention. For example, it is not necessary to apply a dielectric layer. Thus, the dielectric layer may be omitted, and the metal sheet may be etched from both sides by immersing it into the etchant after the forming process. As the dielectric layer is not present to hold metallic elements formed from the thick regions, this process typically is used where the metallic elements formed from the thick regions of the sheet are relatively large and are connected to one another so as to form a coherent metallic element without any dielectric support. For example, lead frames of the types typically made by stamping can be made by processes according to this alternative. Alternatively, if the pattern of thick areas on the metal sheet is discontinuous, the metal parts formed from the thick areas can be separated from one another by continued exposure to the etchant until the thin areas are dissolved away. The separated parts may remain in the etchant bath for a short time after separation occurs, so as to form smooth surfaces on all areas of the parts. For example, the parts may fall away from the metal sheet and may be collected in a screen or basket for removal from the etchant bath. In the processes discussed above, metal is removed nonselectively by a conventional etchant. However, a reverse electroplating process may be used instead. In the reverse electroplating process, the article, including the metal sheet, is immersed in an electrolyte similar to an electrolyte used for plating. A metallic cathode is also immersed in the electrolyte. An electrical potential is imposed between the cathode and the sheet, so that the sheet is positive with respect to the cathode. Material is plated from the sheet onto the cathode, thus removing the metal from the sheet. Such a reverse electroplating process can be conducted at a relatively rapid rate. The metal deposited on the cathode does not form part of the finished component. Therefore, there is no need to limit the plating rate to avoid formation of asperities in the plated deposit.

Figure 5:
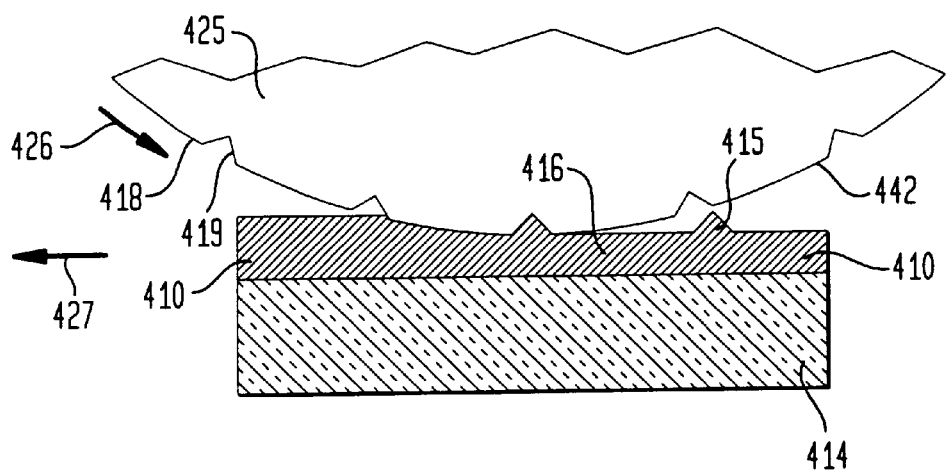
FIG. 5 is a fragmentary, diagrammatic sectional elevational view depicting forming elements and a metal layer during a process in accordance with yet another embodiment of the invention.
Figure 6:
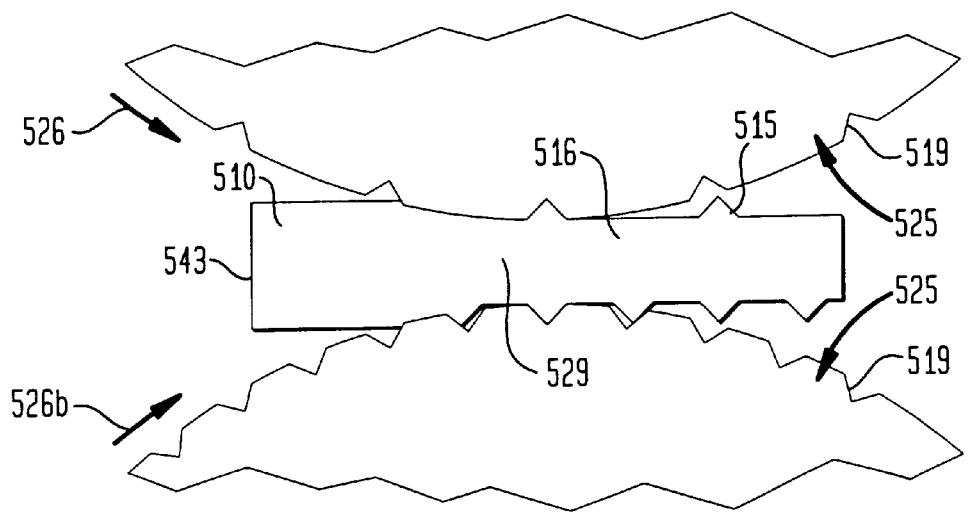
FIG. 6 is a view similar to FIG. 5, but depicting forming elements and a metal layer in a process according to a further embodiment of the invention.

The embossing step can be performed by forming elements other than the reciprocating elements discussed above. As shown in FIG. 5, a roller 425 having raised and recessed portions 418 and 419, respectively, on its circumferential surface 442 is shown in engagement with a metal layer 410 supported by a flat backing element 414. The pattern of raised and recessed portions on the roller 425 may form one or more complete patterns of the desired conductive elements to be formed. For example, where the connection components of FIG. 1g is to be formed, the roller 425 may have one set of raised and recessed portions in the pattern shown in FIG. 1b, or several sets in this pattern so that the pattern repeats itself around the circumferential surface of the roller 425. Roller 425 moves in a rotational direction 426 and a translational direction 427 across the metal layer 410 while backing element 414 remains stationary so that the raised and recessed portions 418 and 419 on the roller 425 are brought into engagement with the metal layer 410, producing thick and thin regions 415 and 416 in the metal layer 414. Alternatively, the roller may rotate while backing element 414 moves in translation. Thus, backing element 414 may be a moving plate, belt or similar transporting device. In a further alternative, two rollers 525 (FIG. 9) may be utilized to emboss the metal layer 10, either or both of them having recessed portions 519 in the pattern of desired metallic elements. In this arrangement, the metal layer 510 is embossed by passing the metal layer between the rollers of forming elements 525 so that the metal layer 510 is squeezed within a nip 529 defined by the two forming elements. The rollers are rotated in feed directions 526a and 526b so that their confronting surfaces move in a downstream direction (to the right as seen in FIG. 6). Thus, the rollers move the sheet 510 downstream and draw the unembossed part 543 of the metal layer 510 into engagement with raised and recessed portions on the circumferential surfaces of rollers 525 as the rollers rotate. FIG. 6 shows the thick and thin regions 515 and 516 formed by the rollers 525 on the embossed portion of the metal layer 510.

In the processes discussed above, the die forms thick regions corresponding to one connection component, on each metal-engaging embossing operation of a press. However, each embossing operation may form thick regions of more than one component, further adding to the number of components produced at a time. Less preferably, the elements of only part of one component can be produced in each embossing step. Registration of elements formed during plural embossing steps would be required to form a complete connection component.

In the processes discussed above, etching or reverse electroplating is employed as the nonselective removal technique. These processes are generally preferred because they remove metal at a rapid rate and are controllable. However, other nonselective removal processes, such as sputtering or abrading the metal layer may be utilized. In sputtering, atoms or ions bombard the metal layer and dislodge atoms of metal from the metal layer. This process normally is slower than etching. However, sputtering can be controlled precisely and therefore can be advantageous where very small conductive elements are to be formed. Further, sputtering can be used even with metals which are difficult to etch. In abrading processes such as lapping, a fine abrasive material is moved against the metal layer, to wear away metal from the metal layer. Abrading is less desirable because the abrasive and metal particles can contaminate the connection component produced.

Figure 7:
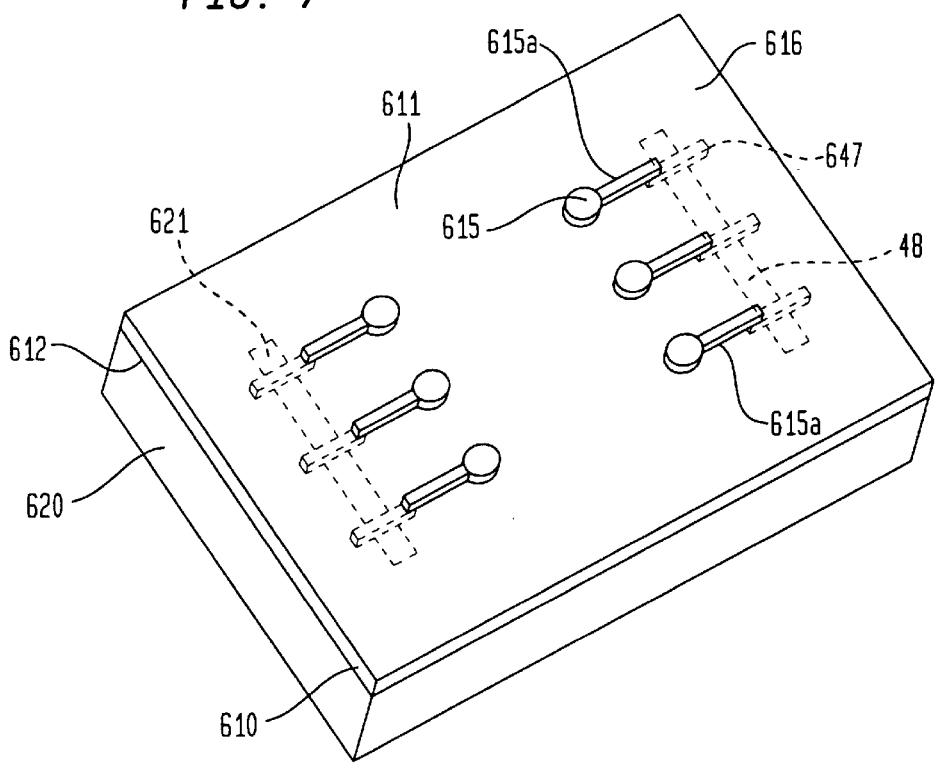
FIG. 7 is a diagrammatic perspective view depicting an article during a process according to a further embodiment of the invention.

The invention may utilize the embossing and nonselective removal steps in conjunction with selective processes to form connection components. For example, the process discussed above in relation to FIGS. 2a–2f uses a selective process in addition to embossing and nonselective removal steps. In a further example, a layer of a first metal such as copper 610 (FIG. 7) is embossed by a die and backing element as described above, producing elongated thick regions 615 and thin regions 616 on the first face 611 of the copper layer 610. The thin regions include elongated strips 615a. The backing element used in the process has a flat surface. Thus, the second face 612 of the embossed copper layer is flat. A photochemical resist is applied to the second face 612 and developed to leave openings in a pattern on the second surface 612. A second metal such as gold is applied in the open regions by electroplating to form gold components 647 on the second face 612 of the copper layer 610. In this example, the gold is deposited so that the gold components overlap with the elongated thick portions 615 of the copper layer 610. A polymeric base material or dielectric layer 620 is applied to the second surface 612 as described above and the resulting assembly is etched from the first surface 611 to remove the thin regions 616 of the copper layer 610. Since the copper is more easily etched than gold, the dielectric layer 620 is not required to protect the gold elements 647. The resulting leads include elongated strips of copper corresponding to elongated strips 615a, joined to gold strips 647. A process in accordance with this aspect of the invention thus can form composite leads as taught in U.S. Pat. No. 5,679,194, the disclosure of which is incorporated by reference herein. Before or after the etching step, apertures 621 are formed through the dielectric layer in alignment with the gold portions 647 of the composite leads. As taught in the '194 patent, it is advantageous to bond the gold portions of the leads to chip contacts, as gold has superior fatigue resistance and bondability. The copper portion of the lead reduces the cost of the component produced.

Figure 8A:
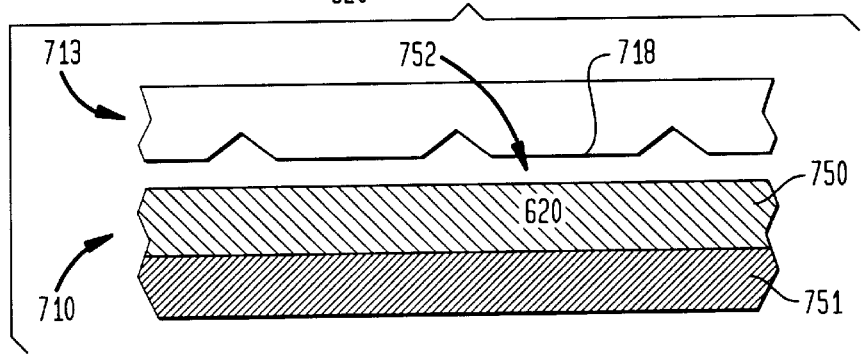
FIG. 8a is a fragmentary, diagrammatic sectional view depicting a forming element and metal layer during a process according to yet another embodiment of the invention.
Figure 8B:
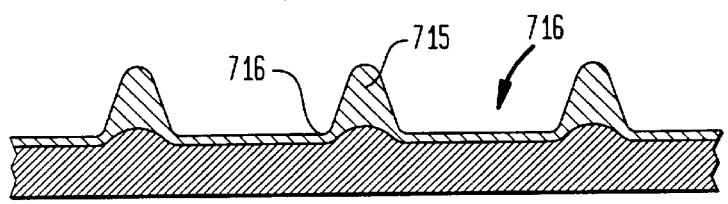
FIG. 8b is a view similar to FIG. 8a but depicting the metal during a later stage of the same process.

In another example, metals of different embossing and/or etching characteristics are used to form the metal layer which is embossed. FIG. 8a shows a layered assembly of gold 750 and copper 751 as the metal layer 710. The gold 750 is more easily embossed than the copper 751 so that the forming element 713 almost entirely displaces the gold in region 752 beneath the raised portions 718 on the forming element 713, as seen in FIG. 1b. The copper in region 752 remains almost unaffected by the forming element 713. After the embossing step, the thin regions 716 of the metal sheet have relatively little gold. During the removing step, any gold in thin regions 716 and all of the copper in the thin regions is removed whereas the gold in thick regions 715 remains as conductive elements.

The base material may be applied before the embossing step or subsequent to the embossing step, as discussed above. The base material need not be a dielectric material. For example, the base material may include a metal such as stainless steel or aluminum having different etching and embossing characteristics from a copper or gold working metal layer. The layered assembly may be embossed on a first surface facing away from the base material, and subjected to a nonselective removal process. The working metal layer such as copper or gold is primarily deformed by the embossing step and the base metal layer is relatively undeformed. A chemical etchant which only attacks the working metal layer is then utilized. The thick regions of the working metal remain as conductive elements supported on the base metal. The conductive elements may be removed from the base metal, as by applying a dielectric material and stripping the dielectric material from the base metal. Another alternative is to apply a base metal layer after the embossing step.

The processes discussed above illustrate use of the invention to form connection components for semiconductors. However, the invention can be applied to manufacture of other electrical components, including circuit panels commonly referred to as circuit boards. The conductors of a circuit board may be formed from the thick regions of the metal sheet. Also, metallic components for non-electronic applications can be made by processes according to the invention.

Although the present invention has been described in considerable detail with reference to certain preferred examples thereof, other versions are possible. Therefore, the spirit and scope of the appended claims should not be limited to the description of the preferred examples contained herein.

What is claimed is:

1. A method of making a microelectronic package, comprising:
   (a) making at least one microelectronic component, comprising the steps of:
      (i) embossing a metal layer having a first face and a second face by engaging said metal layer between a pair of forming elements and deforming said metal layer by engagement with said forming elements so as to form thick and thin regions of metal in said metal layer;
      (ii) removing metal from said thick and thin regions of metal in said metal layer by a removal process which nonselectively removes metal from at least one face of said metal layer; and
      (iii) arresting said removal process after said thin regions of metal have been removed but prior to removal of said thick regions of said metal layer so that said thick regions of metal remain as first metallic elements; and
   (b) assembling each of said at least one microelectronic component with at least one microelectronic element.

2. The method of claim 1, further comprising the step of forming a first layer of metal on said first metallic elements.

3. The method of claim 2, wherein said step of forming a first layer of metal includes electroplating onto said first metallic elements a layer of metallic material different than the metallic material of said first metallic elements.

4. The method of claim 2, further comprising the step of forming a second layer of metal on said first metallic elements, said first layer of metal comprising a layer of barrier metal to prevent interdiffusion of metallic material between said first metallic elements and said second layer of metal.

5. The method of claim 1, wherein said step of making at least one microelectronic component comprises making a plurality of microelectronic components in a continuous strip.

6. The method of claim 5, wherein said at least one microelectronic element comprises a plurality of microelectronic elements and said step of assembling includes assembling each of said plurality of microelectronic components of said continuous strip with each of said plurality of microelectronic elements to form a continuous strip of assemblies.

7. The method of claim 6, further comprising the step of severing said assemblies from one another after said step of assembling.

8. The method of claim 1, wherein said metal layer comprises a metal layer of first metal and the method further comprises depositing a second metal on said second face of said metal layer of first metal.

9. The method of claim 8 further comprising forming additional metallic elements, including applying a photoresist to said second face of said metal layer of first metal and patterning said photoresist.

10. The method of claim 9 wherein said additional metallic elements are formed in contact with said first metallic elements formed from said metal layer.

11. The method of claim 10 wherein said steps of making said at least one microelectronic component includes the step of applying a base material to said second face of said metal layer, overlying said additional metallic elements.

12. The method of claim 11 wherein said steps of making said at least one microelectronic component includes forming apertures in said base material in alignment with said additional metallic elements.

13. The method of claim 1 wherein said step of making at least one microelectronic component forms metallic elements having a width of less than 40 microns.

14. A method of making a microelectronic package, comprising:
   (a) making at least one microelectronic component, comprising the steps of:
      (i) embossing a metal layer having a first face and a second face by engaging said metal layer between a pair of forming elements and deforming said metal layer by engagement with said forming elements so as to form thick and thin regions of metal in said metal layer;
      (ii) removing metal from said thick and thin regions of metal in said metal layer by a removal process which nonselectively removes metal from at least one face of said metal layer;
      (iii) arresting said removal process after said thin regions of metal have been removed but prior to removal of said thick regions of said metal layer so that said thick regions of metal remain as metallic elements;
      (iv) applying a base material to said first face of said metal layer after said embossing step so that a coherent layer of said base material intimately surrounds said protruding thick regions of metal and so that said thick regions of metal in said metal layer remain as conductive elements embedded in said base material after said removing and arresting steps; and
   (b) assembling each said at least one microelectronic component with at least one microelectronic element.

15. The method of claim 14 wherein said step of applying a base material includes applying a dielectric material.

16. The method of claim 14, wherein said base material comprises a thermoplastic material applied by lamination.

17. The method of claim 14, wherein said steps of making at least one microelectronic component includes the step of forming at least one aperture in said layer of base material in alignment with at least some of said metallic elements.

18. The method of claim 17, wherein said step of making at least one microelectronic component is performed so as to form said metallic elements as elongated leads and said step of forming said at least one aperture includes forming apertures in alignment with said elongated leads so that the leads extend at least partially across said apertures.

19. The method of claim 14 wherein said step of applying a base material is performed so that said thick regions of metal have a portion releasably adhered to said layer of base material.

20. The method of claim 19 wherein said metallic elements have a first end fixed to said layer of base material and a second end which is releasable from said layer of base material.

21. The method of claim 19, wherein said steps of making one or more microelectronic components includes applying a release-promoting material to said metal layer prior to the steps of applying a base material.

22. A method of making a microelectronic package, comprising:
- (a) making at least one microelectronic component, comprising the steps of:
  - (i) embossing a metal layer having a first face and a second face by engaging said metal layer between a pair of forming elements and deforming said metal layer by engagement with said elements so as to form thick and thin regions of metal in said metal layer;
  - (ii) removing metal from said thick and thin regions of metal in said metal layer by a removal process which nonselectively removes metal from at least one face of said metal layer;
  - (iii) arresting said removal process after said thin regions of metal have been removed but prior to removal of said thick regions of metal in said metal layer so that said thick regions of metal in said metal layer remain as metallic elements;
  - (iv) said step of embossing being performed so as to form thick regions of metal including thick regions of metal having different thicknesses, and wherein said removing step is arrested before the thinnest of said thick regions of metal have been removed so that said thick regions of metal remain as metallic elements, said metallic elements having different thicknesses; and
- (b) assembling each said at least one microelectronic component with at least one microelectronic element.

23. The method of claim 22 wherein said step of making at least one microelectronic component includes applying a base material to said first face of said metal layer so as to form a coherent layer of base material and forming an aperture in said base material in alignment with at least one of said metallic elements.

24. A method of claim 23 wherein said step of embossing is performed so as to form said metallic elements as elongated leads, at least one of said elongated leads extending across said aperture.

25. The method of claim 24, wherein said step of assembling includes forcing said at least one of said elongated leads downwardly into said aperture.

26. The method of claim 25, wherein one of said thick regions comprises a frangible section of one of said elongated leads and said elongated lead having said frangible section is forced downwardly so as to break said frangible section.

27. The method of claim 26, wherein said step of assembling includes bonding said elongated leads to contacts on said at least one microelectronic element.

28. The method of claim 24, wherein the step of assembling includes applying spots of a bondable alloy to said elongated leads.

29. The method of claim 28, wherein said step of applying spots of bondable material includes applying a photoresist and patterning said photoresist to form said spots of bonding material on said elongated leads.

30. The method of claim 28, wherein said step of assembling includes bonding said spots of bondable material to contacts on said at least one microelectronic element.

31. A method of making a microelectronic package, comprising:
- (a) making at least one microelectronic component, comprising the steps of:
  - (i) embossing a metal layer having a first face and a second face by engaging said metal layer between a pair of forming elements and deforming said metal layer by engagement with said elements so as to form thick and thin regions of metal in said metal layer, at least some of the thick regions of metal having tapering sides;
  - (ii) removing metal from said thick and thin regions of metal in said metal layer by a removal process which nonselectively removes metal from at least one face of said metal layer;
  - (iii) arresting said removal process after said thin regions have been removed but prior to removal of said thick regions of metal so that said thick regions of metal remain as metallic elements,
  - (iv) said steps of embossing, removing metal and arresting said removal process forming metallic elements including tapering sides;
  - (v) applying a base material to said first face of said metal layer after said embossing step so that a coherent layer of said base material intimately surrounds said thick regions of metal and so that said thick regions of metal remain as conductive elements embedded in said base material after said arresting step, said tapering sides tapering outwardly toward a surface of said layer of base material; and
- (b) assembling each of said at least one microelectronic component with at least one microelectronic element.

32. The method of claim 31, wherein said step of embossing is performed so that said metallic elements each have an elongated portion, a tip-end, and a terminal end, said tip-end having a width greater than a width of said elongated portion.

33. The method of claim 32, wherein said tip-ends are formed having tapering sides.

34. The method of claim 32, wherein said steps of making at least one microelectronic component includes applying spots of bondable alloy to said tip-ends of said metallic elements.

35. The method of claim 34, wherein said step of assembling includes engaging said tip-ends with contacts of said at least one microelectronic element, said contacts being in a pattern corresponding with said tip-ends, and bonding said spots of bondable material to said contacts.

36. The method of claim 35, wherein said step of assembling further includes the step of moving said at least one microelectronic component and said one or more microelectronic elements away from each other so that said tip-ends are detached from said base material.

37. A method of packaging a microelectronic element, comprising:
- (a) making at least one microelectronic component, comprising the steps of:
  - (i) embossing a metal layer having a first face and a second face by engaging said metal layer between a pair of forming elements having recesses and projections in registrations and deforming said metal layer by engagement with said elements so as to form thick and thin regions of metal in said metal layer;

(ii) removing metal from said thick and thin regions of metal in said metal layer by a removal process which nonselectively removes metal from at least one face of said metal layer; and (iii) arresting said removal process after said thin regions of metal have been removed but prior to removal of said thick regions of metal so that said thick regions of said metal layer remain as metallic elements; and (b) assembling each of said at least one microelectronic component with at least one microelectronic element.

38. The method of claim 37 wherein said steps of embossing and removing are performed so as to form metallic elements having cup-shaped features each having an open end at said first face of said metal layer and a closed end at said second face of said metal layer.

39. The method of claim 38, wherein said steps of embossing and removing are performed so as to form a collar-shaped portion at said first face surrounding said open end of each of said cup-shaped features.

40. The method of claim 39, wherein said base material is applied to said second face of said metal layer so that said closed end of each said cup-shaped feature is embedded in said layer of said base material.

41. The method of claim 40 wherein said steps of making at least one microelectronic component includes forming an aperture in said base material in alignment with each said closed end of said cup-shaped feature.

42. The method of claim 41 wherein said step of assembling includes electrically connecting said closed end to said at least one microelectronic element.

* * * * *